(12) United States Patent
Zaliznyak et al.

(10) Patent No.: US 6,985,021 B1
(45) Date of Patent: Jan. 10, 2006

(54) CIRCUITS AND TECHNIQUES FOR CONDITIONING DIFFERENTIAL SIGNALS

(75) Inventors: Arch Zaliznyak, San Jose, CA (US); William Bereza, Nepean (CA); Henry Lui, San Jose, CA (US); Chong Lee, San Ramon, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/652,521

(22) Filed: Aug. 29, 2003

(51) Int. Cl.
*H03F 3/45* (2006.01)
(52) U.S. Cl. ...................... 327/333; 330/144
(58) Field of Classification Search ............ 327/65–68, 327/306–312, 331–333, 560–563; 330/144, 330/252, 258, 261, 278, 284
See application file for complete search history.

(56) References Cited

U.S. PATENT DOCUMENTS

| | | | |
|---|---|---|---|
| 3,619,800 A | * 11/1971 | Lyghounis et al. | ......... 330/259 |
| 4,037,170 A | * 7/1977 | Richards | ....................... 330/69 |
| 4,536,888 A | * 8/1985 | Wilson | ....................... 379/395 |
| 6,590,436 B2 | * 7/2003 | Jordanger et al. | .......... 327/333 |
| 6,735,302 B1 | * 5/2004 | Caine et al. | ................ 379/405 |

* cited by examiner

*Primary Examiner*—Minh Nguyen
(74) *Attorney, Agent, or Firm*—Fish & Neave IP Group of Ropes & Gray LLP; Andrew Van Court (57) ABSTRACT

Circuitry is provided that conditions a differential input signal such that when the signal is received by a multi-standard differential input buffer, the buffer is able to process the conditioned signal without pronounced increases in propagation delay, thereby keeping signal jitter to a minimum. The circuitry further enables input buffers to operate according to desired operating parameters even when the supply voltage powering the input buffer is relatively low. The circuitry operates by shifting the common-mode voltage to a range that puts the input buffer in a favorable common-mode voltage range of operation. The circuitry may be coupled with a programmably controlled amplifier that amplifies the amplitude of the conditioned differential signal prior to being received by the input buffer. Amplifying the signal prevents problems typically associated with data-dependent jitter and intersymbol interference by boosting the voltage amplitude to a level that is readily processed by the input buffer.

33 Claims, 9 Drawing Sheets

CIRCUITS AND TECHNIQUES FOR CONDITIONING DIFFERENTIAL SIGNALS

BACKGROUND OF THE INVENTION

This invention relates to circuitry and methods that enhance the operation of input buffer circuitry, and more particularly to circuitry and methods that condition signals prior to being received by the input buffer circuitry.

Input buffer circuitry is commonly used to receive signals and then transmit the received signals to other circuitry. Input buffer circuitry can be used to buffer, for example, circuitry (e.g., a programmable logic device) from input/output pins. Input buffers can be specifically designed to handle a particular type of signal (e.g., a differential signal) and can also be designed to operate according to a particular signaling standard such as Low Voltage Differential Signaling ("LVDS"). Other input buffers, such as multi-standard differential input buffers, are designed to support several signaling standards, including but not limited to, LVDS, Low Voltage Emitter Coupled Logic ("LVPECL"), LDT, and other standards used in high speed applications. Multi-standard differential input buffers are particularly useful in programmable applications because one input buffer can be used, as opposed to several, to support the desired signaling standards.

While multi-standard differential input buffers can handle two or more signaling standards, they can be susceptible to several drawbacks, especially when powered by a low voltage power supply. One such drawback is signal jitter of the output signal produced by the input buffer. Signal jitter causes a signal to appear erratic and random and it can create difficulties for other circuitry to process the signal (because the circuitry may not be able to tell if the signal is a logic LOW or HIGH). Signal jitter can be caused by prolonged time delays in signal propagation through the buffer. In general, all signals are subject to propagation delays when processed by an input buffer, but signals of certain voltages are processed much slower, resulting in prolonged propagation delays.

Sources of prolonged time delay include signals having certain ranges of common-mode voltage and relatively low differential amplitude voltage. Certain ranges of common-mode voltage can result in pronounced propagation delays because multi-standard input buffers operating with low voltage power supply voltage (e.g., at about 1.5 volts or less) may not be able to quickly process signals operating within that particular range of common-mode voltages. In addition, a relatively low differential amplitude voltage can cause propagation delays because the signal may be too weak to quickly drive the appropriate circuitry. If the voltage is too low, problems associated with inter-signal interference can occur, which can cause data-dependent jitter.

Therefore, it is an object of this invention to provide circuitry that mitigates jitter of the output signal of a multi-standard differential input buffer being supplied by a relatively low voltage power supply.

SUMMARY OF THE INVENTION

In accordance with the principles of this invention, circuitry is provided to mitigate undesired effects experienced by multi-standard differential input buffers (hereinafter "input buffer") being powered by a low voltage power supply. The circuitry enables existing input buffers to operate with low voltage power supplies (e.g., below about 1.5 volts) and meet data signal processing requirements. For example, the data signal processing requirements for gigabit LVDS, dynamic phase alignment (hereafter "DPA") and clock data recovery (hereinafter "CDR") are met using the circuitry of this invention. To enable the input buffer to meet these requirements, the circuitry of the invention conditions/transforms/alters the differential signal prior to being provided to the input buffer. The circuitry (sometimes referred to herein as feed-forward circuitry) alters the incoming differential signal according to a resistor ratio and the power supply voltage being provided to the circuitry. This power supply voltage is typically the same supply powering the input buffer. Hence, the transformation of the differential signal can be programmable based on the values chosen by the resistor ratio.

As a result of this transformation, the common-mode of the conditioned input signal is expanded and shifted relative to the common-mode voltage originally associated with the signal. For example, if the common-mode voltage of the incoming differential signal ranges anywhere from 0 volts to 2.0 volts, the transformed common-mode voltage may result in ranging from 0.8 to 1.5 volts. Thus, when the input buffer receives the transformed differential signal, it sees a signal with a shifted common-mode range which advantageously puts the input buffer in a favorable common-mode mode of operation. Now that the input buffer receives this shifted differential signal, the input buffer does not experience substantial increases in propagation delay for a given common-mode voltage. Hence, the range of common-mode voltages in which the input buffer can operate is increased. That is, the input buffer is able to process a greater range of common-mode voltages because it does not receive common-mode voltages that would otherwise cause pronounced propagation delays. In addition, because occurrences of pronounced propagation delays are minimized, jitter tolerance is increased.

The feed-forward circuitry can be used in combination with a programmable amplifier that amplifies the magnitude of the differential amplitude voltage of the altered signal prior to being received by the input buffer. Amplifying the differential amplitude voltage puts the input buffer in an advantageous operating mode by enabling it to quickly detect low voltage signals that would not otherwise be readily detected. Thus, by amplifying the altered signal, the propagation delay is significantly reduced over the range of differential input voltage amplitude received by the input buffer. One advantage of amplifying the signal is that it reduces or eliminates data-dependent jitter caused by intersymbol interference.

Further features of the invention, its nature and various advantages will be more apparent from the accompanying drawings and the following detailed descriptions.

DETAILED DESCRIPTION OF THE PREFERRED EMBODIMENTS

Figure 1:
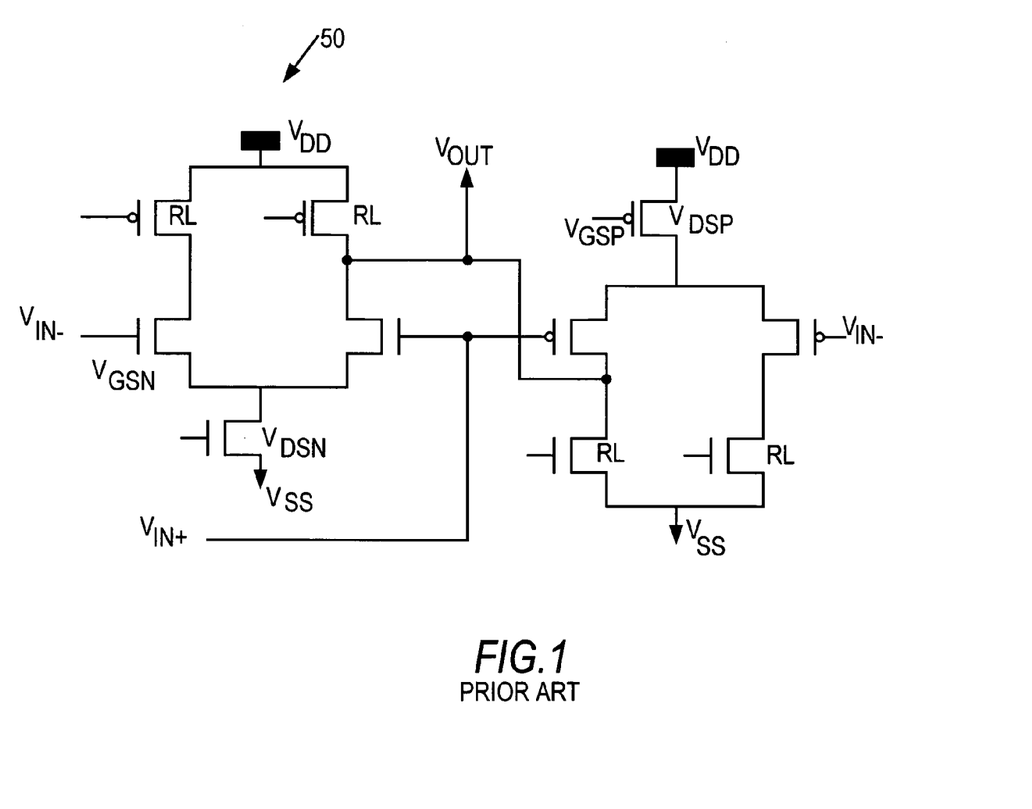
FIG. 1 shows a schematic diagram of a known multi-standard differential input buffer that can be used in combination with circuitry of this invention.

FIG. 1 shows a known multi-standard differential input buffer 50 that receives a differential input signal and produces a single output signal. In order for input buffer 50 to support multiple input standards, buffer 50 preferably operates over a wide range of common-mode voltage, while at the same time processing differential signals with a substantially constant propagation delay as a function of common-mode voltage. The common-mode in differential signaling is the DC level that should be midway between the two differential signals. The common-mode operational range of buffer 50 is generally defined by the saturation characteristics of the transistors. It is therefore preferable to maintain the transistors in saturation, otherwise when the transistors begin to fall out of saturation, propagation delays begin to increase.

In general, buffer 50 operates as follows. When the common-mode input voltage is less than combined gate-to-source voltage and drain-to-source voltage of the N-type MOSFETs (e.g., $V_{GSN}$ and $V_{DSN}$), the N-type differential stage is OFF and the P-type differential stage is ON. Thus, in this condition, the P-type differential stage is driving $V_{OUT}$. When the common-mode input voltage is above the combination of $V_{GSN}$ and $V_{DSN}$, but below the combined gate-to-source and drain-to-source voltage of the P-type transistors, subtracted from the drain voltage (e.g., $V_{DD}-(|V_{GSP}|+V_{DSP})$, both N and P-type differential pairs are ON and are driving $V_{OUT}$. $V_{DD}$ is also known as the power supply voltage. When both differential pairs are driving $V_{OUT}$, this is known as an overlap mode of operation.

In another mode of operation, the P-type differential pair is OFF and the N-type differential pair is ON when the common-mode input voltage is above the power supply voltage subtracted from the combined gate-to-source voltage and drain-to-source voltage of the P-type MOSFETs (e.g., $V_{DD}-(|V_{GSP}|+V_{DSP})$. In this mode of operation, only the N-type differential pair is driving $V_{OUT}$.

Figure 2A:
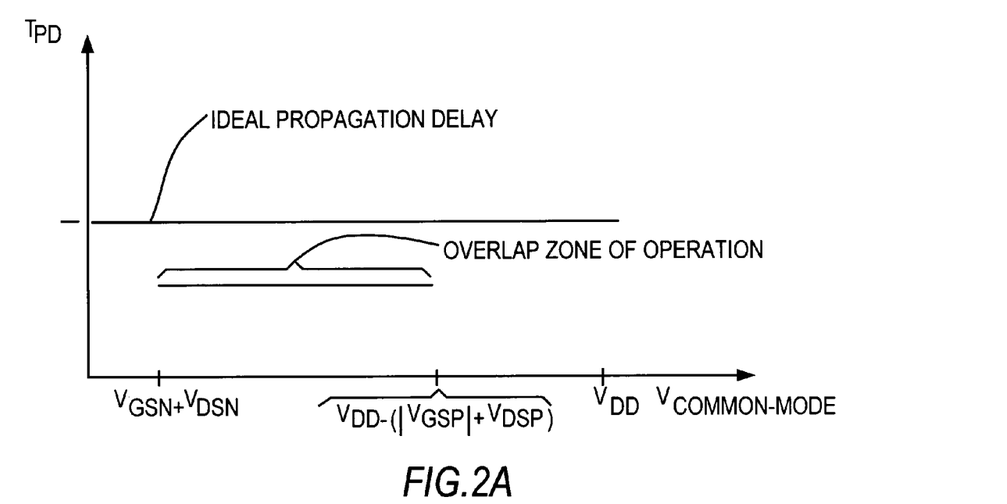
FIG. 2A shows a graph illustrating a propagation delay curve as a function of common-mode voltage for an ideal multi-standard differential input buffer.

FIG. 2A shows a graph illustrating an ideal relationship of propagation delay as a function of common-mode voltage as applied to a multi-standard differential input buffer (e.g., buffer 50 of FIG. 1). As shown, the propagation delay incurred by the input buffer is constant over the entire common-mode voltage range. FIG. 2 shows the overlap zone of operation and the various common-mode voltages at which different parts of buffer 50 operate, as discussed in the preceding paragraph.

Figure 2B:
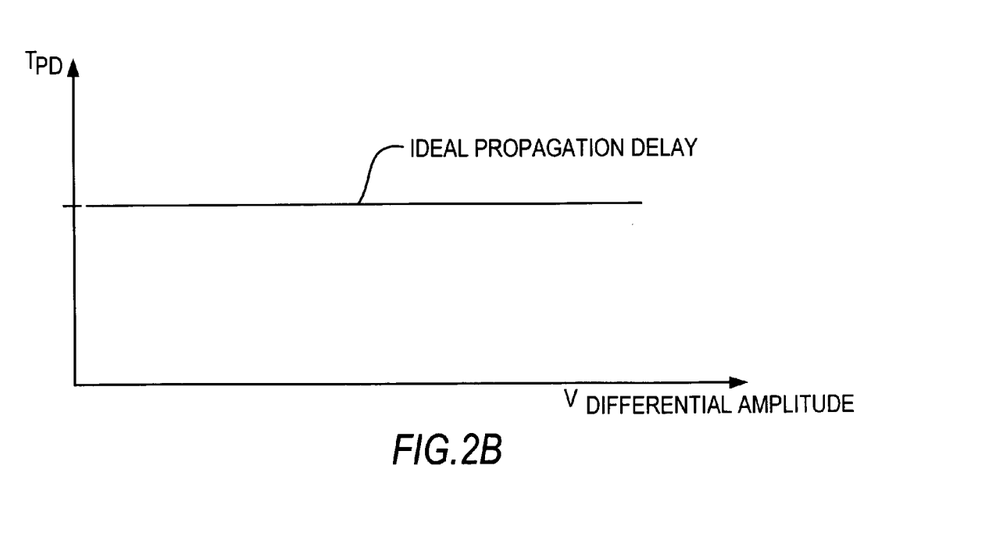
FIG. 2B shows a graph illustrating a propagation delay curve as a function of differential input amplitude voltage for an ideal multi-standard input buffer.

FIG. 2B shows another graph illustrating an ideal relationship of propagation delay as a function of differential input amplitude voltage. To further explain what differential input amplitude voltage is, consider the following example. One lead of the differential signal may have a 1.2 volt signal, and the other lead of the differential signal may have a 0.8 volt signal. Based on these values, the differential amplitude voltage is 0.4 volts, and the common-mode voltage is 1.0 volt. As shown in FIG. 2B, the propagation delay is constant over the entire range of the differential input amplitude voltage.

The graphs in FIGS. 2A and 2B represent ideal propagation delay characteristics as a function of common-mode voltage and differential input amplitude voltage, respectively. These propagation delay characteristics of multi-standard differential input buffers are ideal and are difficult to achieve in practice. In practice, the propagation delay may not be constant over a predefined voltage range (e.g., common-mode voltage or differential input amplitude voltage) when being powered by low voltage power supply voltage (e.g., a voltage level in which $V_{DD}$ of FIG. 1 is about 1.5 volts or below). When the power supply voltage drops to such low levels, it may create a situation in which there is no overlapping mode of operation, but rather a dead-zone of operation for a particular range of common-mode input voltage. In a dead-zone of operation, the P-type or N-type differential amplifiers barely turn ON, thus resulting in a substantial propagation delay.

Figure 3A:
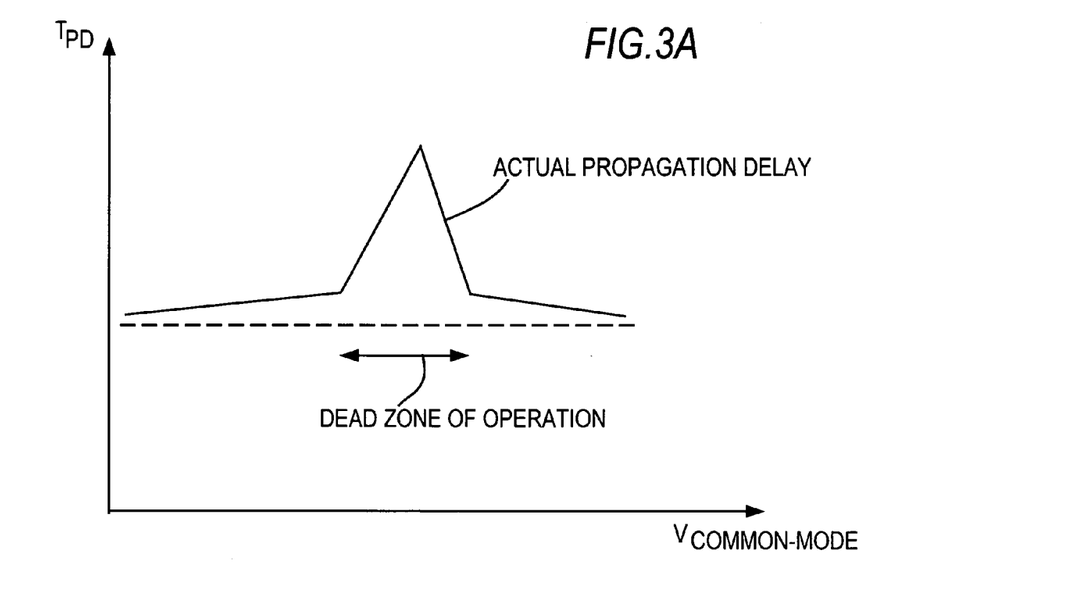
FIG. 3A shows a graph of a propagation delay curve as a function of common-mode voltage of a traditional multi-standard differential input buffer.

The dead-zone is shown in FIG. 3A, which shows a graph of the propagation delay plotted as a function of common-mode input voltage when the power supply voltage levels are at relatively low levels. The dead zone of operation for input buffer 50 is about one-half of the power supply voltage, or about 0.7 volts, assuming that ($V_{DD}$) is about 1.5 volts and the combined voltage of ($V_{GSN}+V_{DSN}$) is about equal to the voltage of ($V_{DD}-(|V_{GSP}|+V_{DSP})$ Thus, when the common-mode voltage is at or around one-half the power supply voltage (e.g., $V_{DD}$), the propagation delay increases dramatically, as shown in FIG. 3A. The circuitry of the present invention avoids dead-zone operation altogether by shifting the common-mode voltage to such an extent that the input buffer does not receive differential signals that have common-mode voltages that operate at or near the dead zone.

Figure 3B:
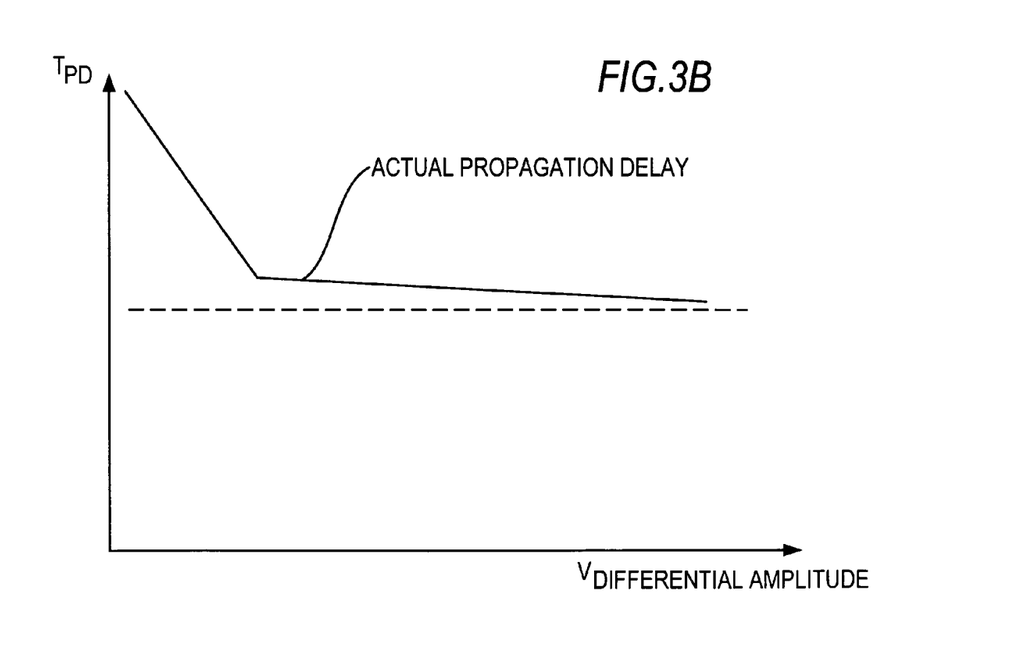
FIG. 3B shows a graph of a propagation delay curve as a function of differential input voltage amplitude of a traditional multi-standard differential input buffer.

Multi-standard differential input buffers are often limited by poor gain characteristics when processing low voltage differential amplitude signals. Because the differential input buffers exhibit poor gain for low voltage differential amplitude signals, the propagation delay of the signal may increase relative to higher amplitude signals. This is shown in FIG. 3B, which shows a graph illustrating increased propagation delay as a function of differential input amplitude voltage. As the differential amplitude voltage falls below a certain magnitude, the propagation delay increases dramatically. The circuitry of the present invention avoids increased propagation delays by amplifying the differential amplitude voltage of the differential signal before it is received by the input buffer.

Note that the dynamic nature of the signals being transmitted to the input buffer can cause the common-mode voltage and the differential voltage amplitude to vary. That is, the common-mode voltage and the voltage amplitude can shift along the graphs shown in FIGS. 3A and 3B, respectively. For example, the signal may be in a desirable part of the graph in one instance, but in an undesirable part in another instance. The circuitry of this invention ensures that the signal is always in the desirable part of the graph, regardless of the dynamic voltage variation of the received data.

Figure 4:
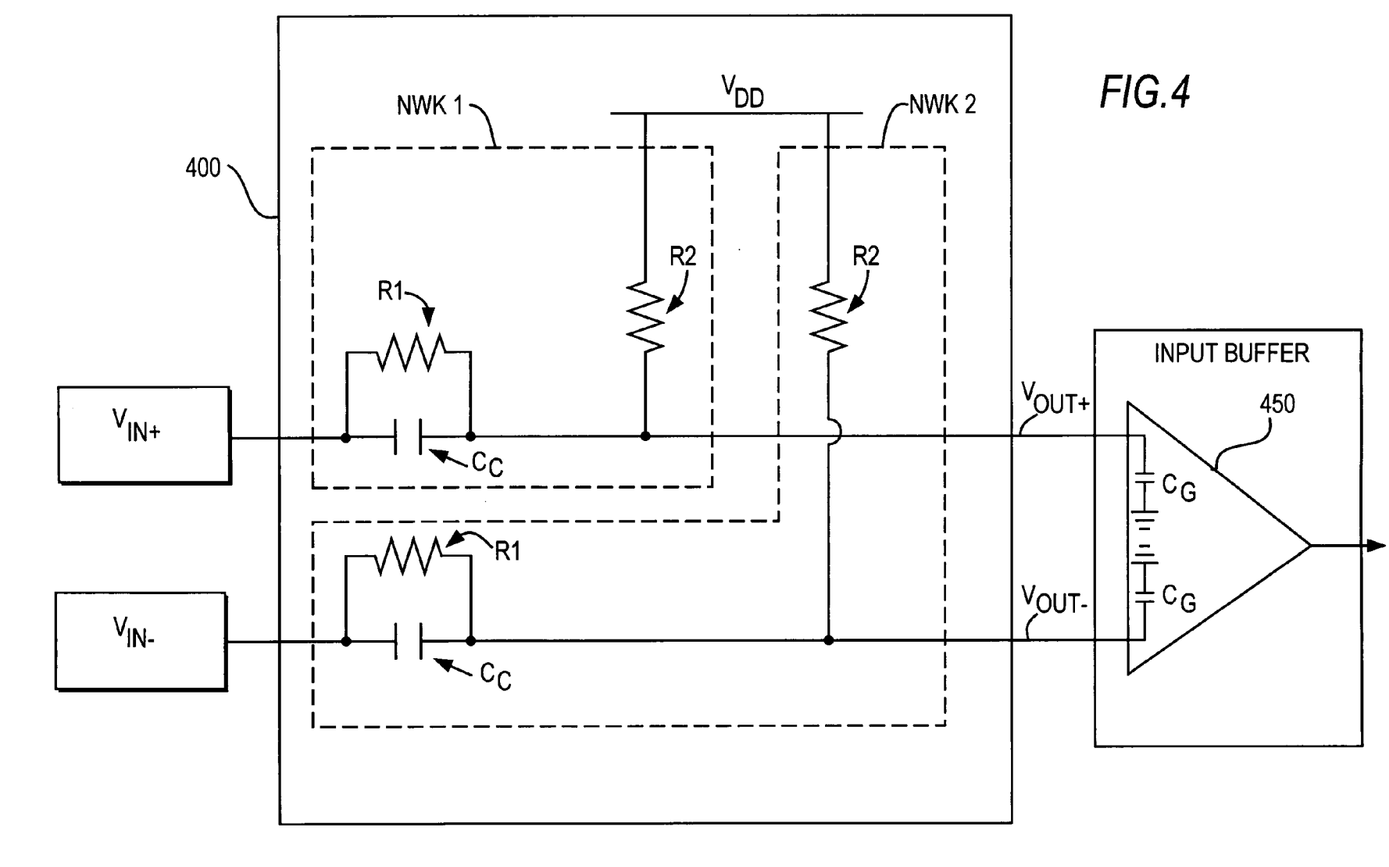
FIG. 4 shows a schematic diagram of an illustrative embodiment of feed-forward circuitry constructed in accordance with the invention.

FIG. 4 shows an illustrative embodiment of feed-forward circuitry 400 that operates in conjunction with a multi-standard differential input buffer 450 in accordance with the principles of the invention. Circuitry 400 includes the following: resistor R1 connected in parallel with capacitor Cc, the combination of which is connection in series between $V_{IN+}$ and $V_{OUT+}$; another resistor R1 connected in parallel with another capacitor Cc, the combination of which is connected in series between $V_{IN-}$ and $V_{OUT-}$; resistor R2 connected between $V_{DD}$ and the node existing between $V_{OUT+}$ and the parallel combination of R1 and Cc; another resistor R2 connected between $V_{DD}$ and the node existing between $V_{OUT-}$ and the other parallel combination of R1 and Cc. $V_{DD}$ is the voltage of the power supply voltage powering input buffer 450 and circuitry 400. To facilitate the following discussion, several components of circuitry 400 are outlined in two separate dashed line boxes to identify two circuit networks within circuitry 400, labeled as NWK1 and NWK2. In general, the same named elements in each network are substantially equal to one another in size/value. For example, R1 in NWK1 is substantially equal to R1 in NWK2. In a preferred embodiment, the same named elements in each network are equal to one another.

Circuitry 400 is coupled between the transmission nodes of the differential input signal ($V_{IN+}$ and $V_{IN-}$) and the input nodes of the multi-standard input buffer (labeled in FIG. 4 as $V_{OUT+}$ and $V_{OUT-}$). In general, circuitry 400 conditions the differential input signal before the signal is received by buffer 450. Buffer 450 can be, for example, a buffer like buffer 50 of FIG. 1. As shown, buffer 450 has Cg to indicate that gate capacitance and/or other intrinsic capacitance that is present in the buffer. Circuitry 400 conditions/alters the common-mode voltage of the differential input signal. This conditioned differential input signal enables buffer 450 to process the differential signal without experiencing pronounced propagation delays. As will be discussed below, buffer 450 can process signals without pronounced delay because of the relation of R1 and Cc to R2 and Cg. Because undesired propagation delays are eliminated, circuitry 400 effectively enables buffer 450 to meet the jitter budgets for each signaling standard (e.g., LVDS, LVPECL, LDT, etc.). The following further discusses how circuitry 400 enhances the multi-standard buffers ability to process differential signals operating over a wide range of common-mode voltages while being powered by a low voltage power supply.

Circuitry 400 conditions the common-mode voltage of the incoming differential signal such that buffer 450 operates in a preferable common-mode range. In other words, circuitry 400 performs a transfer function on the differential input signal to condition the common-mode voltage of the differential signal. As a result of the transfer function, the range of common-mode voltages that can be processed by buffer 450 is expanded and shifted. Thus, by expanding and shifting the common-mode range of the differential signal, buffer 450 advantageously sees common-mode voltages that do not cause undesired propagation delays. For example, circuitry 400 may condition the common-mode voltage of the differential signal so that it is shifted to the right of the dead zone as shown in FIG. 3A. Shifting the common-mode voltage right of the dead zone ensures that the common-mode voltage is high enough to enable the transistors in the input buffer to operate properly.

Figure 5:
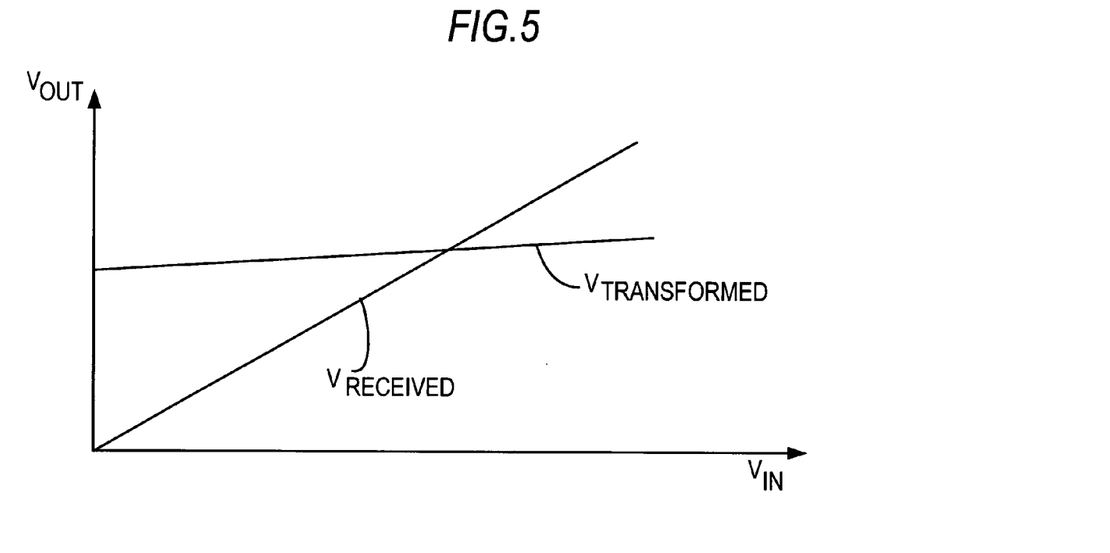
FIG. 5 shows a graph illustrating the results of having the circuitry of FIG. 4 alter the differential input signal in accordance with the invention.

A graphical illustration of the result of circuitry 400 conditioning the common-mode of the differential input signal is shown in FIG. 5. The graph in FIG. 5 has an X-axis depicting the magnitude of the common-mode voltage entering circuitry 400 and a Y-axis depicting the magnitude of the common-mode voltage leaving circuitry 400. $V_{RECEIVED}$ represents an illustrative range of common-mode voltage received by circuitry 400. $V_{RECEIVED}$ also illustrates a range of common-mode voltage that would be received by the input circuitry without being conditioned by circuitry 400. $V_{TRANSFORMED}$ represents an illustrative range of the common-mode voltage as a result of being conditioned by circuitry 400, and that is transmitted to the input buffer circuitry. As shown, $V_{TRANSFORMED}$ has been "flattened" relative to $V_{RECEIVED}$. That is, the disparity between high and low voltage of $V_{TRANSFORMED}$ is less than that of $V_{RECEIVED}$ (i.e., the common-mode voltage has been expanded and shifted).

Circuitry 400 operates by altering the entering differential signal according to $V_{DD}$ and the R1/R2 resistor ratio in NWK1 and NWK2. The combination of R1 and R2 essentially functions as a voltage divider, producing a transformed common-mode voltage signal based on $V_{DD}$, R1, R2, and the common-mode voltage of the differential signal. Those of skill in the art will appreciate that the values chosen for R1 and R2 can affect the transformation of the common-mode voltage. In one embodiment, it may be desirable to select R1 and R2 values that result in expanding and shifting the common-mode voltage to a range that puts the input buffer in a favorable common-mode operation. Hence, depending on the resistance values chosen for R1 and R2, the transformation functionality of circuitry 400 can be programmable.

Circuitry 400 includes Cc to cancel the gate capacitance of buffer 450, the metallization capacitance of buffer 450, the parasitic capacitances that can occur within circuitry 400 and that caused by the interconnection of circuitry 400 to buffer 450. For example, Cc can cancel a parasitic pole that is formed from the combination of R1, R2, and the input capacitance of input buffer 450. Cancellation of parasitic capacitances helps prevent unnecessary delays in signal propagation. In high frequency applications, the capacitance value chosen for Cc becomes a critical design factor to consider because higher frequency operation generate more noise and other deleterious conditions that can effect propagation of signals.

If desired, the capacitance of Cc can be programmable. A programmable Cc provides equalization functionality to circuitry 400. The equalization functionality enables circuitry 400 to control the phase angle of the differential signal received by buffer 450. (A differential signal can be represented as a complex number, and as such, it has a magnitude and a phase angle.) Thus, by controlling the phase angle of the differential signal, circuitry 400 can optimize the signal for processing by buffer 450. Techniques for programming the capacitance are known in the art. For example, two or more capacitors can be selectively connected in parallel. As each additional capacitor is added, the capacitance increases, and if a capacitor is selectively disconnected, the capacitance decreases.

Any type of capacitor can be used for Cc, but a metal-finger type of capacitor is preferably used because this type of capacitor is better suited for electrostatic discharge (ESD) compliance.

Figure 6:
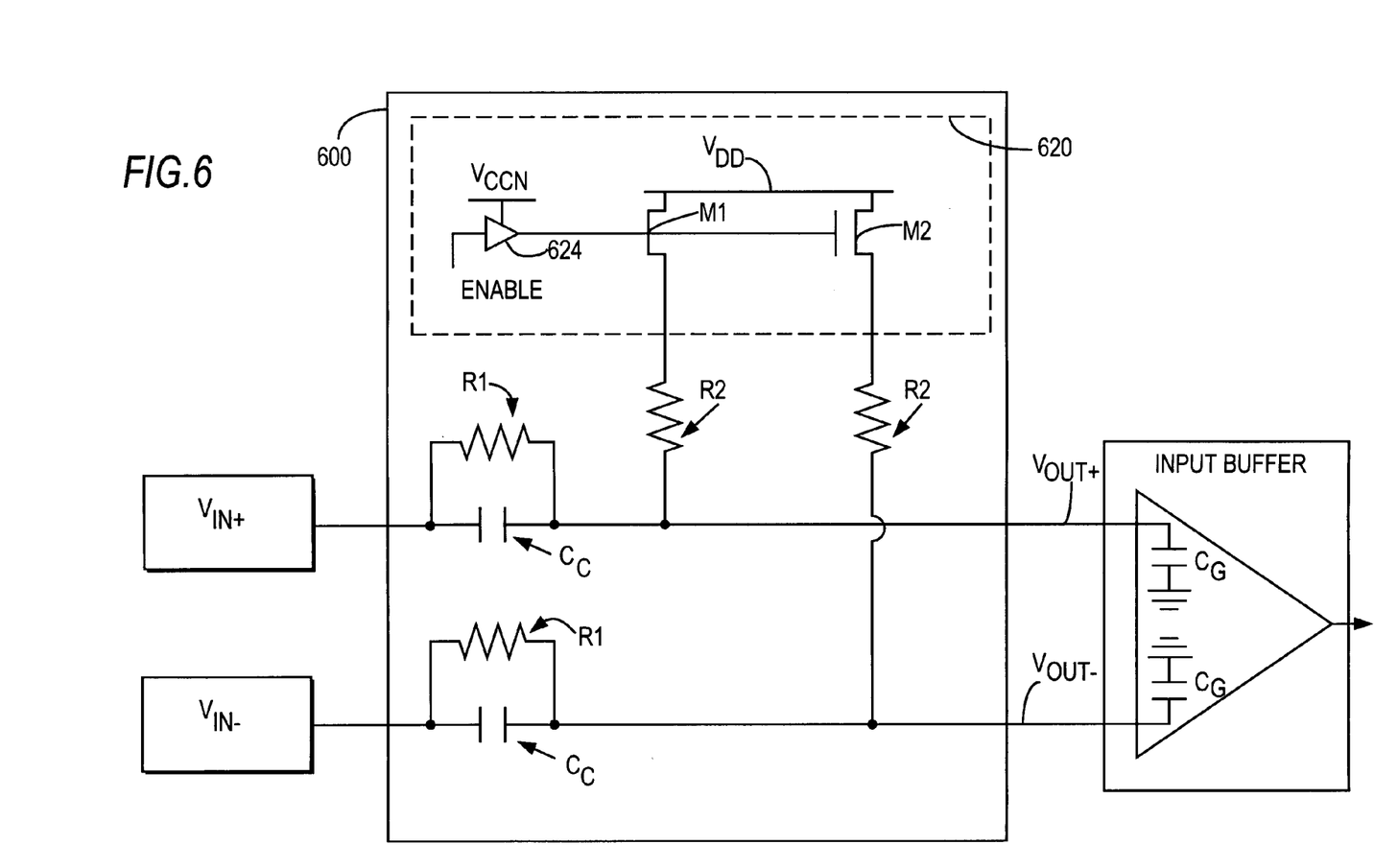
FIG. 6 shows a schematic diagram of an illustrative embodiment of feed-forward circuitry having enablement circuitry constructed in accordance with the invention.

FIG. 6 shows an illustrative embodiment of a feed-forward circuitry 600 having enable circuitry 620. Enable circuitry 620 imparts a dual-mode functionality to circuitry 600. In one mode, circuitry 600 conditions the common-mode voltage of a differential signal. In the other mode, the conditioning functionality of circuitry 600 is disabled. One advantage of deactivating circuitry 600 is that it prevents current leakage if, for example, the differential input pins $V_{IN+}$ and $V_{IN-}$ are not being used to transmit a differential signal.

As shown, enable circuitry 620 includes transistors M1 and M2 (e.g., N-type MOSFETs) and control element 624. Transistors M1 and M2 are connected between R2 and $V_{DD}$ and control element 624 is connected to an ENABLE input, $V_{CCD}$, and the gates of M1 and M2. The transfer functionality of circuitry 600 is active when M1 and M2 are turned ON. M1 and M2 can be turned ON when the ENABLE input is asserted HIGH, which results in the application of $V_{CCD}$ to the gates of M1 and M2. When M1 and M2 are ON, a pathway is formed to electrically connect R2 to $V_{DD}$. When ENABLE is LOW, transistors M1 and M2 are OFF, preventing resistors R2 from being electrically connected to $V_{DD}$. Thus, when M1 and M2 are OFF, the transform functionality of circuitry 600 is disabled.

Note that several alternative implementations of enable circuitry 620 can be employed, and that the foregoing circuitry is merely an example of one such implementation. For example, use of $V_{CCN}$ can be avoided if M1 and M2 are P-type MOSFETs. In this configuration, the voltage supplied by $V_{DD}$ is connected to the gates of M1 and M2, and is preferably low enough to ensure that M1 and M2 are turned ON when the ENABLE input is asserted.

The above-described methods and circuitry for conditioning the common-mode voltage of differential signals advantageously enables multi-standard input buffers to operate across a wide range of common-mode voltage, while being powered by a low voltage power source. Yet, in accordance with the principles of this invention, there are additional advantages that are provided by using alternatives of the feed-forward circuitry of this invention. One such advantage is to exercise control over the amplitude of the differential amplitude voltage of the differential signal, as discussed below.

Figure 7:
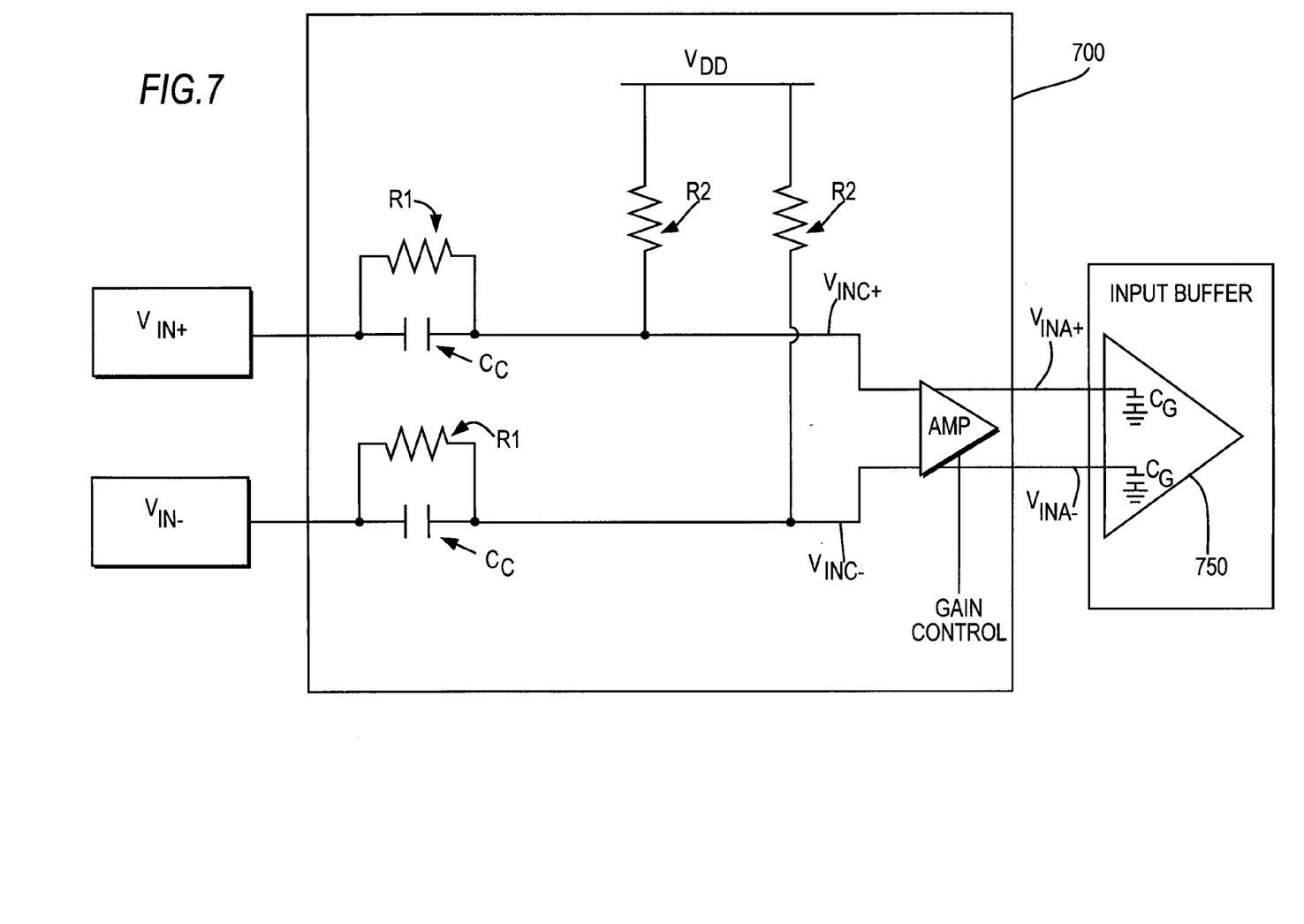
FIG. 7 shows a schematic diagram of an illustrative embodiment of feed-forward circuitry operating in combination with a programmable gain pre-amplifier in accordance with the invention.

FIG. 7 shows an illustrative embodiment of feed-forward circuitry having a programmable gain amplifier that operates in connection with a multi-standard differential input buffer in accordance with the principles of the invention. Circuitry 700 of FIG. 7 has substantially all the same elements as circuitry 400 of FIG. 4, except for the addition of one element: an amplifier AMP. Circuitry 700 can also include optional enable circuitry 620 of FIG. 6. AMP receives a differential signal which has been conditioned by the portion of the circuit equivalent to circuitry 400. The conditioned differential signal is labeled as $V_{INC+}$ and $V_{INC-}$ in FIG. 7. The outputs of AMP, $V_{INA+}$ and $V_{INA-}$, are connected to multi-standard input buffer 750. AMP is programmable to amplify $V_{INC+}$ and $V_{INC-}$ according to its gain control input.

Figure 8:
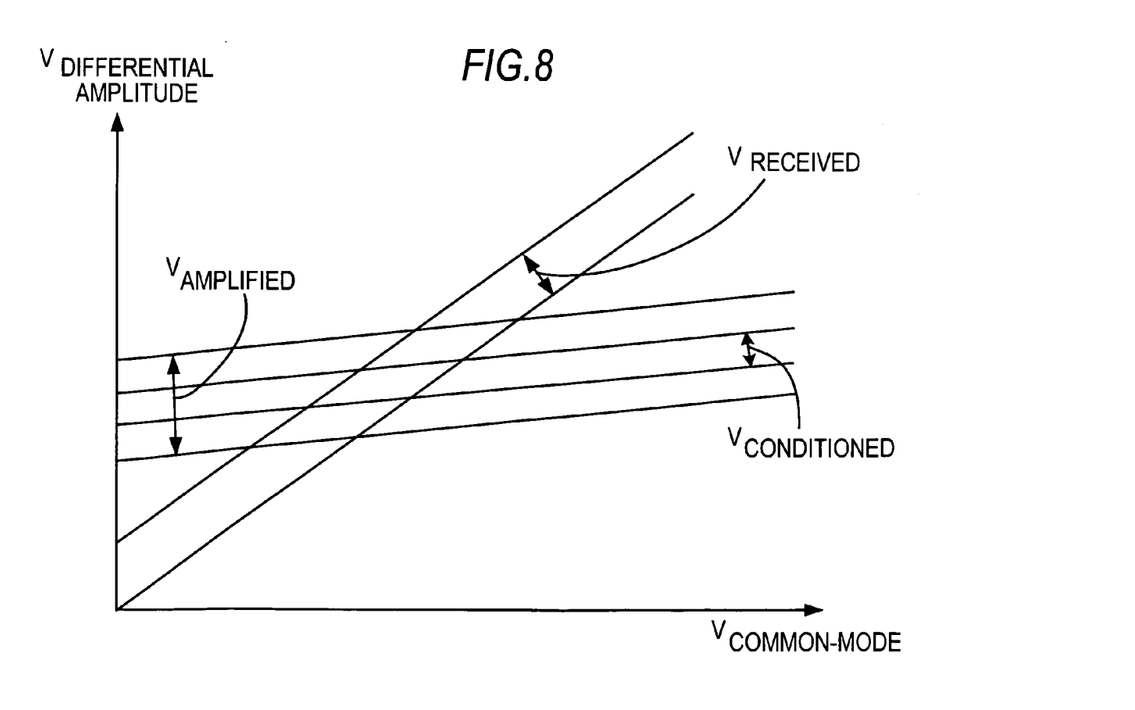
FIG. 8 shows a graph illustrating the result of having the circuit of FIG. 7 alter and amplify the differential input signal in accordance with the invention.

Amplifying the differential signal further conditions the signal to advantageously provide signals that buffer 750 can readily process, resulting in reduced propagations delays, and consequently, less jitter. For example, circuitry 700 advantageously eliminates problems associated with data-dependent jitter by boosting the voltage amplitude of the signal. In the event a signal transitions from a biased voltage and the resultant voltage amplitude of the signal is too low, AMP amplifies the voltage of the signal to ensure that input buffer 750 processes the signal without undergoing a prolonged propagation delay. A graphical representation of having had amplified the differential signal is illustrated in FIG. 8. The X-axis is represented by the common-mode voltage (VCM) and the Y-axis is represented by the differential voltage amplitude of the differential signal.

FIG. 8 shows the differential amplitude of the signal received by circuitry 700 (shown as $V_{RECEIVED}$) and the differential amplitude of the signal provided by AMP (shown as $V_{AMPLIFIED}$). FIG. 8 also shows $V_{CONDITIONED}$, which illustrates the differential amplitude of the signal after being subjected to the transfer function portion of circuitry 700. Note that for the $V_{RECEIVED}$, $V_{AMPLIFIED}$, and $V_{CONDITIONED}$ signals, the differential voltage amplitude is illustrated as a function of the distance between the respective leads of the differential signal.

The following discusses by way of example how circuitry 700 is used to condition the differential input signal. To begin, circuitry 700 receives $V_{RECEIVED}$. While $V_{RECEIVED}$ may initially have a satisfactory differential voltage amplitude, it may be operating in common-mode voltage that is unsatisfactory. To prevent potential issues with the common-mode voltage, the differential signal is conditioned so as to put the common-mode in a preferable common-mode voltage (illustrated as $V_{CONDITIONED}$). During transformation of the differential signal, the differential voltage amplitude is compressed. In some instances, the transformation may produce a differential amplitude voltage that is too low (if it was not already too low to begin with). Then the conditioned signal is amplified (shown in FIG. 8 as $V_{AMPLIFIED}$) according to a programmable gain value, resulting in an amplified conditioned signal that enables buffer 750 to process the signal without a pronounced increase in propagation delay, while being powered by a low voltage power supply. Thus, by ensuring that the differential voltage amplitude is above a predetermined minimum voltage, buffer 750 is not forced to operate at voltage ranges that would otherwise hamper performance.

Circuitry 700 of FIG. 7 also cancels the parasitic capacitances, as discussed above in conjunction with FIG. 4.

Figure 9:
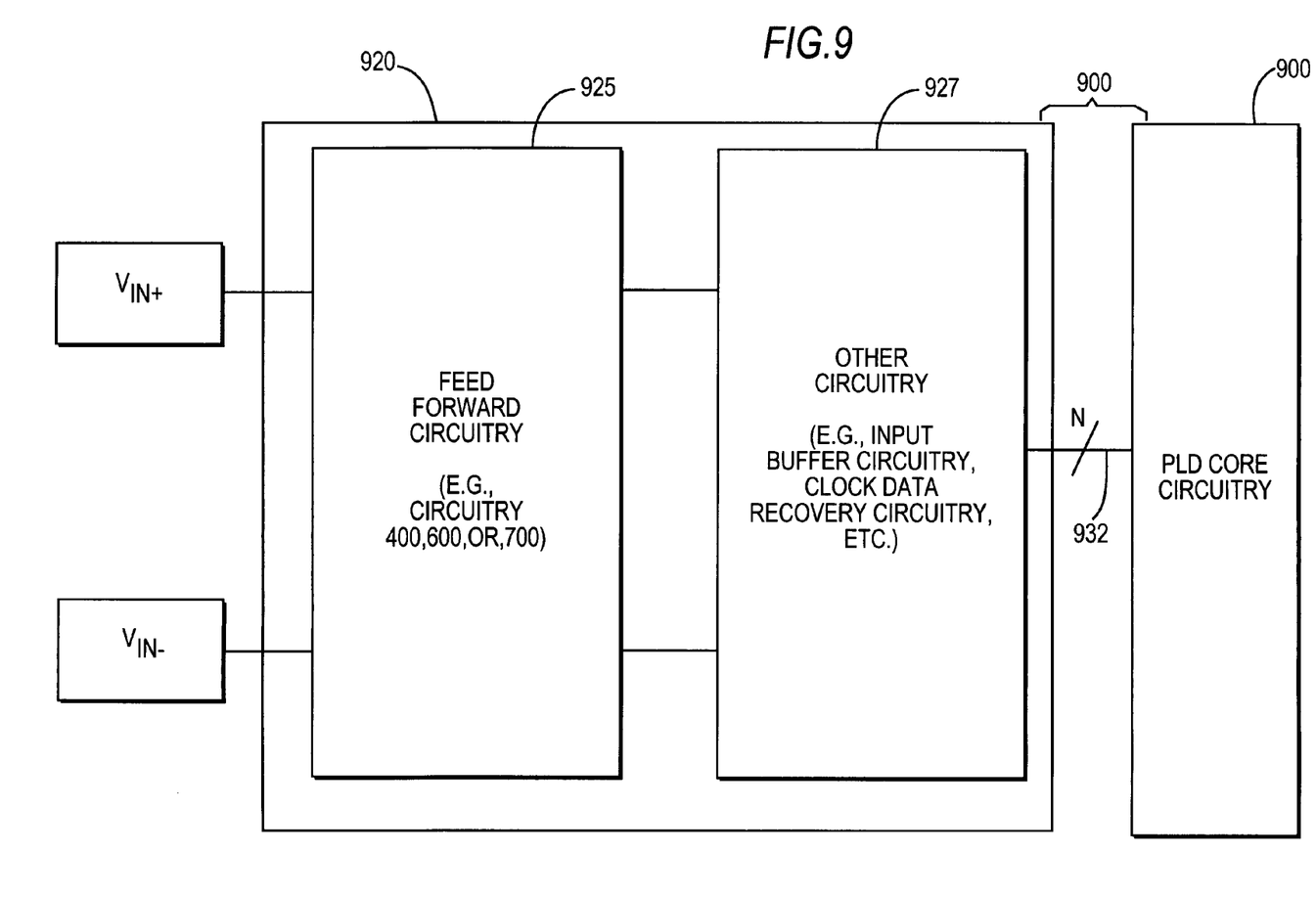
FIG. 9 shows an illustrative larger context in which the circuitry of the invention can be used.

The illustrative embodiments shown in FIGS. 4, 6, and 7 can be used in the context of programmable logic device ("PLD") circuitry 900 that includes receiver circuitry 920 and PLD core circuitry 930, as shown in FIG. 9. PLD 900 is typically (although not necessarily) a single integrated circuit. (Alternatively, circuitry 900 could be, for example, a multi-chip module including two or more separate integrated circuits.) The illustrative context shown in FIG. 9 is by no means the only possible context. For example, instead of being used with PLD circuitry (like 930), receiver circuitry 920 could instead be used with many other types of utilization circuitry such as microprocessor circuitry, DPA circuitry, and CDR circuitry. Many other possible contexts for the invention will occur to those skilled in the art having the benefit of the disclosure contained in this specification. Note that the following description of FIG. 9 is understood to be illustrative and not limiting.

Receiver 920 receives a differential signal via leads $V_{IN+}$ and $V_{IN-}$. This differential signal is applied to circuitry in receiver 920 and processed before being transmitted to core circuitry 930. Receiver 920 includes circuitry 925 (e.g., circuitry 400, 600, and 700) of the invention. Circuitry 925 may receive the differential signal before other circuits (e.g., CDR or DPA circuitry) in receiver 920 receive the signal. Other receiver circuitry 927 can include, but is not limited to, input buffer circuitry, CDR circuitry, PDA circuitry, byte alignment circuitry, and other circuitry associated with data processing. In accordance with this invention, conditioning of the differential signal prior to the signal being processed by any other signals advantageously enables the other circuitry (e.g., buffer circuitry) to operate within optimal operating parameters.

Other receiver circuitry 27 perform various data processing steps using the incoming differential signal such as converting the serial data into parallel data, generating run-length violation flags and byte-alignment flags, and generating a clock signal. The parallel data, flag data, and clock signal are transmitted by receiver 920 to PLD core circuitry 930 via multiple leads 932.

The discussion concerning operation of receiver 920 and the signals it provides to PLD core circuitry 930 is not discussed in detail because it is not particularly pertinent to the circuitry of this invention. But assuming that receiver-920-types of signal processing are employed, more information about illustrative suitable circuitry can be found in such references as Aung et al. U.S. patent application publication No. 20010033188, Lee et al. U.S. Pat. No. 6,650,140, Venkata et al. U.S. Pat. No. 6,750,675, and Venkata et al. U.S. patent application No. 10/273,899, filed Oct. 16, 2002. It is not believed that the material in these references is essential for understanding and/or practicing any aspect of the present invention. But if additional information is desired or needed for any purpose, it is available from one or more of these references.

Figure 10:
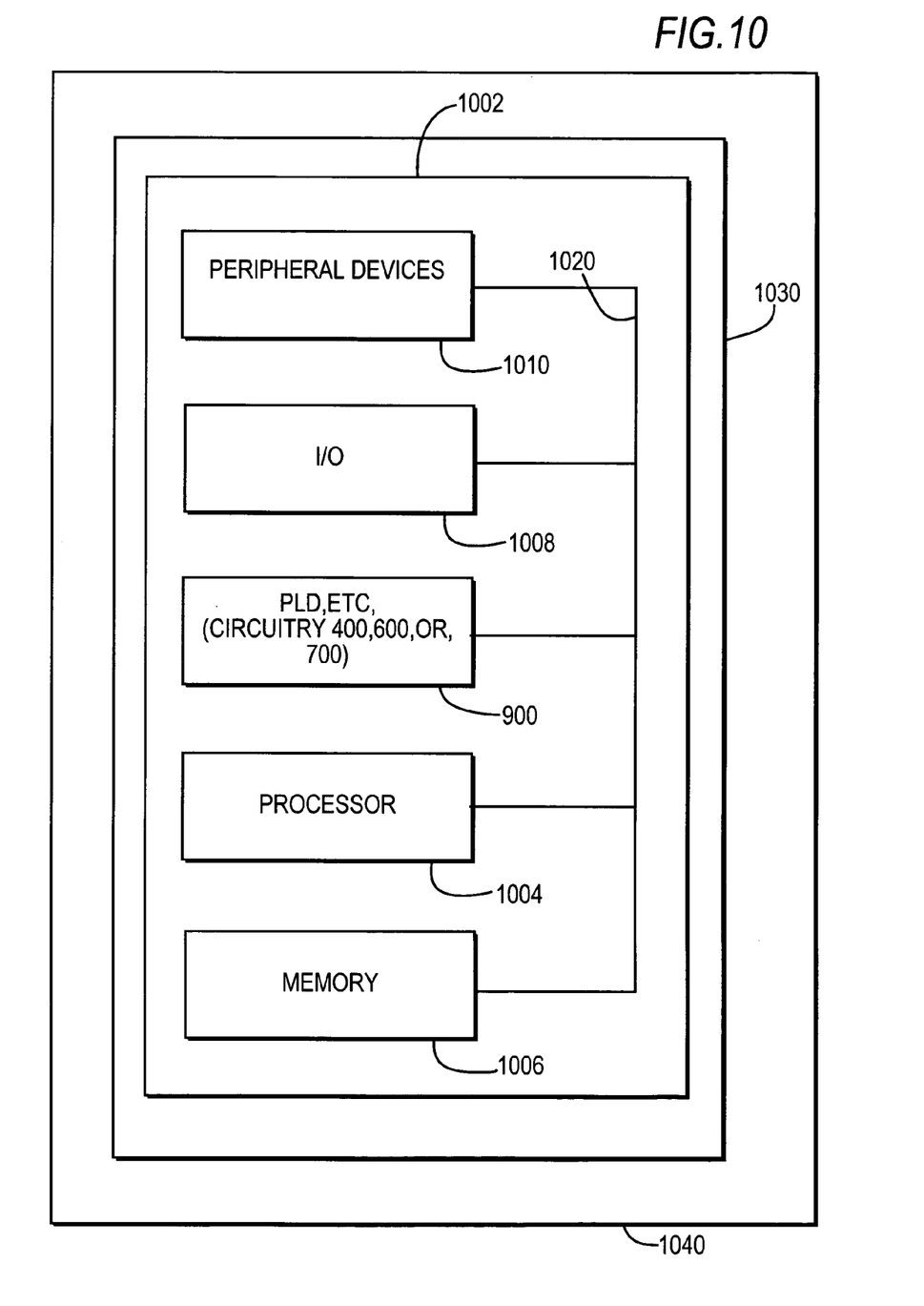
FIG. 10 shows another illustrative larger context in which circuitry of the invention can be used.

FIG. 10 illustrates possible use of circuitry 400, 600, or 700 of the types shown in FIGS. 4, 6, and 7, respectively, in a data processing system 1002 in accordance with the invention. Data processing system 1002 may include one or more of the following components: a processor 1004, a memory 1006, I/O circuitry 1008, and peripheral devices 1010. These components are coupled together by a system bus or other interconnections 1020 and are populated on a circuit board 1030 (e.g., a printed circuit board) that is contained in an end-user system 1040. Communication among the various components shown in FIG. 10 and/or with external circuitry may be of the type described above in connection with FIGS. 1–9 to any desired extent.

FIG. 10 shows an illustrative larger context in which the invention may be employed. The invention can be used for receiving and conditioning one or more input signals of any one or more of elements 1004, 1006, 1008, and 1010 from system bus or other interconnections 1020. Although the invention is equally applicable in many other types of systems, the illustrative system 1002 shown in FIG. 10 may be generally described as a data processing system.

System 1002 can be used in a wide variety of applications, such as computer networking, data networking, instrumentation, video processing, digital signal processing, or any other application where the advantage of using programmable or reprogrammable logic is desirable.

It will be understood that the foregoing is only illustrative of the principles of the invention and that various modifications can be made by those skilled in the art without departing from the scope and spirit of the invention.

What is claimed is:

1. Circuitry for use with differential input circuitry that is powered by a low voltage power supply which provides a predetermined low voltage level, comprising:
    a first network and a second network, each network including a pair of resistors and a capacitor, each network coupled to receive a respective lead of a differential signal and coupled to the low voltage power supply, wherein the differential signal has a common-mode voltage;
    wherein the first and second networks alter the common-mode voltage of the differential signal based on the resistance values of the pair of resistors in each network and the predetermined voltage level, and wherein the differential signal with the altered common-mode voltage is transmitted to the differential input circuitry; and
    enable circuitry coupled to each network and operable to prevent each network from altering the common-mode voltage of the differential signal.

2. The circuitry defined in claim 1, wherein each network voltage divides the common-mode voltage of the differential signal in proportion to the resistor ratio of each pair of resistors and said predetermined voltage level.

3. The circuitry defined in claim 1, the differential signal having a differential amplitude voltage, the circuitry further comprising:
    an amplifier circuit connected to receive the differential signal with the altered common-mode voltage and amplify the differential amplitude voltage of the differential signal with the altered common-mode voltage.

4. The circuitry defined in claim 3, wherein the amplifier circuit amplifies the differential amplitude voltage based on a programmable gain.

5. The circuitry defined in claim 1, wherein the capacitor in each network cancels substantially all parasitic capacitance associated with the circuitry and the interconnection of the circuitry with the input circuitry.

6. The circuitry defined in claim 1, wherein the capacitor in each network is a metal-finger type of capacitor.

7. The circuitry defined in claim 1, wherein the capacitor in each network is part of equalization circuitry that programmably controls the capacitance of the circuitry.

8. The circuitry defined in claim 1, wherein the differential input circuitry comprises a multi-standard differential input buffer.

9. The circuitry defined in claim 1, further comprising a programmable logic device in which the circuitry operates.

10. The circuitry defined in claim 1, further comprising:
    a digital processing logic device comprising:
        processing circuitry; and
        memory coupled to the processing circuitry, wherein at least one of the processing circuitry and the memory is coupled to said first and second networks.

11. The circuitry defined in claim 1, further comprising an integrated circuit on which the circuitry operates.

12. The circuitry defined in claim 1, further comprising:
a printed circuit board on which the circuitry is mounted.

13. The circuitry defined in claim 12 further comprising:
a memory mounted on the printed circuit board.

14. The circuitry defined in claim 12 further comprising:
processing circuitry mounted on the printed circuit board.

15. The circuitry defined in claim 1, further comprising:
    enable circuitry coupled to each network and said low voltage power supply and operative to selectively couple each network to said low voltage power supply.

16. The circuitry defined in claim 1, wherein said pair of resistors and said capacitor of said first network are first and second resistors and a first capacitor, respectively, and wherein said pair of resistors and said capacitor of said second network are third and fourth resistors and a second capacitor, respectively,
    wherein said first resistor is coupled in parallel to said first capacitor, the parallel combination of said first resistor and said first capacitor is coupled between a first differential signal lead and a first differential circuitry input;

wherein said third resistor is coupled in parallel to said second capacitor, the parallel combination of said third resistor and second capacitor is coupled between a second differential signal lead and a second differential circuitry input;

wherein said second resistor is selectively coupled to said low voltage power supply and a node existing between the parallel combination of said first resistor and first capacitor and said first differential circuitry input; and wherein said fourth resistor is selectively coupled to said low voltage power supply and a node existing between the parallel combination of said third resistor and second capacitor and said second differential circuitry input.

17. A method of using circuitry that includes first and second networks coupled to a low voltage power supply that provides a predetermined voltage level, each network including a pair of resistors and a capacitor, the circuitry coupled to receive a differential signal and is coupled to a multi-standard differential input buffer, wherein the input buffer is coupled to said low voltage power supply, the method comprising:

receiving the differential signal, the received differential signal having a common-mode voltage;

altering the common-mode voltage of the differential signal based on a resistor ratio of each pair of resistors to produce a differential signal with an altered common-mode voltage;

transmitting the differential signal with the altered common-mode voltage to the input buffer; and selectively preventing the circuitry from altering the common-mode voltage of the differential signal.

18. The method defined in claim 17, the altering comprising:

voltage dividing the common-mode voltage of the differential signal in proportion to the resistor ratio of each pair of resistors and said predetermined voltage level.

19. The method defined in claim 17, further comprising: selecting sizes of each resistor in the pair of resistors of each network to define the extent to which the common-mode voltage is altered.

20. The method defined in claim 17, further comprising: cancelling substantially all parasitic capacitance associated with the circuitry and the interconnection of the circuitry to the input buffer.

21. The method defined in claim 17, further comprising: selecting the capacitance of the capacitor in each network to substantially cancel all parasitic capacitance associated with the circuitry and the interconnection of the circuitry with the input buffer.

22. The method defined in claim 21, wherein the capacitance selected for each network is programmable.

23. The method defined in claim 17, further comprising: using the circuitry to enable the input buffer to process differential signals having common-mode voltages that would not otherwise be processed, while still meeting performance parameters of the input buffer.

24. The method of claim 23, wherein the performance parameters are selected from the group consisting of a signal jitter requirement and time delay for signal propagation through the input buffer.

25. A method of using circuitry that includes an amplifier and first and second networks, each network including a pair of resistors and a capacitor, the circuitry coupled to receive a differential signal and is coupled to a multi-standard differential input buffer, the method comprising:

receiving the differential signal, the received differential signal having a differential amplitude voltage;

amplifying the differential amplitude voltage of the differential signal based on a programmable gain of the amplifier to produce a differential signal with an amplified differential amplitude voltage; and transmitting the differential signal with the amplified differential amplitude voltage to the input buffer.

26. The method defined in claim 25, the differential signal having a common-mode voltage and the method further comprising:

altering the common-mode voltage of the differential signal based on a resistor ratio of each pair of resistors to produce a differential signal with an altered common-mode voltage.

27. The method defined in claim 26, wherein the amplifying comprises amplifying the differential amplitude voltage of the differential signal with an altered common-mode voltage.

28. The method defined in claim 26, the altering comprising:

voltage dividing the common-mode voltage of the differential signal in proportion to the resistor ratio of each pair of resistors and a power supply voltage provided to the first and second networks.

29. The method defined in claim 26, further comprising: selecting sizes of each resistor in the pair of resistors of each network to define the extent to which the common-mode voltage is altered.

30. The method defined in claim 25, further comprising: cancelling substantially all parasitic capacitance associated with the circuitry and the interconnection of the circuitry to the input buffer.

31. The method defined in claim 25, further comprising: selecting the capacitance of the capacitor in each network to substantially cancel all parasitic capacitance associated with the circuitry and the interconnection of the circuitry with the input buffer.

32. The method defined in claim 25, further comprising: using the circuitry to enable the input buffer to process differential signals having differential amplitude voltages that would not otherwise be processed, while still meeting performance parameters of the input buffer.

33. The method of claim 32, wherein the performance parameters are selected from the group consisting of a signal jitter requirement and time delay for signal propagation through the input buffer.

* * * * *